(12) United States Patent
Liu et al.

(10) Patent No.: US 11,545,498 B2
(45) Date of Patent: Jan. 3, 2023

(54) OTP MEMORY AND METHOD FOR MAKING THE SAME

(71) Applicant: Hua Hong Semiconductor (Wuxi) Limited, Wuxi (CN)

(72) Inventors: Junwen Liu, Wuxi (CN); Hualun Chen, Wuxi (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 181 days.

(21) Appl. No.: 17/111,099

(22) Filed: Dec. 3, 2020

(65) Prior Publication Data

US 2021/0202506 A1    Jul. 1, 2021

(30) Foreign Application Priority Data

Dec. 26, 2019 (CN) .......................... 201911364749.3

(51) Int. Cl.
| | |
|---|---|
| *H01L 27/115* | (2017.01) |
| *H01L 21/265* | (2006.01) |
| *H01L 21/336* | (2006.01) |
| *H01L 27/112* | (2006.01) |
| *H01L 29/788* | (2006.01) |
| *H01L 29/423* | (2006.01) |
| *G11C 17/08* | (2006.01) |
| *G11C 16/04* | (2006.01) |

(52) U.S. Cl.
CPC .. *H01L 27/11206* (2013.01); *H01L 21/26513* (2013.01); *G11C 16/0433* (2013.01); *G11C 17/08* (2013.01); *H01L 29/42324* (2013.01); *H01L 29/7885* (2013.01)

(58) Field of Classification Search
CPC .......... H01L 27/11206; H01L 27/1122; H01L 27/11504; H01L 27/11519; H01L 29/42324; H01L 29/7885; H01L 21/26513; G11C 17/06; G11C 17/12; G11C 16/0433
See application file for complete search history.

(56) References Cited

U.S. PATENT DOCUMENTS

| | | | |
|---|---|---|---|
| 5,042,009 | A | 8/1991 | Kazerounian et al. |
| 6,151,242 | A | 11/2000 | Takashima |
| (Continued) | | | |

FOREIGN PATENT DOCUMENTS

| | | | |
|---|---|---|---|
| CN | 101034671 A | 9/2007 | |
| CN | 101057331 A | 10/2007 | |
| (Continued) | | | |

*Primary Examiner* — Mary A Wilczewski
(74) *Attorney, Agent, or Firm* — Murtha Cullina LLP (57) ABSTRACT

The present application discloses an OTP memory. A cell structure includes a first active region and a second active region that intersect vertically; an EDNMOS is formed in the first active region, and a PMOS is formed in the second active region; a body portion of a channel region of the PMOS is formed a drift region of the EDNMOS, a first polysilicon gate of the EDNMOS serves as a control gate, and a second polysilicon gate of the PMOS serves as a floating gate; and the PMOS is programmed by means of hot carriers generated in the drift region of the EDNMOS. The present application further discloses a method for manufacturing an OTP memory. In the present application, high-speed writing can be implemented.

15 Claims, 4 Drawing Sheets

(56) References Cited

U.S. PATENT DOCUMENTS

| | | | |
|---|---|---|---|
| 9,196,377 B1 * | 11/2015 | Park | G11C 13/0004 |
| 9,418,754 B2 * | 8/2016 | Park | G11C 17/16 |
| 2002/0064071 A1 | 5/2002 | Takahashi et al. | |
| 2004/0155234 A1 | 8/2004 | Ishimaru et al. | |
| 2004/0262680 A1 | 12/2004 | Ehwald et al. | |
| 2006/0170055 A1 | 8/2006 | Mitros et al. | |
| 2007/0064494 A1 * | 3/2007 | Morton | H01L 27/115 365/185.28 |
| 2008/0061347 A1 * | 3/2008 | Mallikararjunaswamy | H01L 27/115 257/314 |
| 2012/0287715 A1 * | 11/2012 | Liu | H01L 29/7816 438/257 |
| 2014/0361358 A1 * | 12/2014 | Chen | H01L 27/11519 257/315 |
| 2015/0091074 A1 * | 4/2015 | Hsu | H01L 29/4916 257/316 |
| 2016/0181436 A1 | 6/2016 | Liu | |
| 2018/0204944 A1 * | 7/2018 | Schippel | H01L 29/4983 |
| 2019/0386138 A1 | 12/2019 | Zhang | |
| 2021/0202506 A1 * | 7/2021 | Liu | H01L 27/11206 |

FOREIGN PATENT DOCUMENTS

| | | | | |
|---|---|---|---|---|
| CN | 101441889 A | | 5/2009 | |
| CN | 102263110 A | | 11/2011 | |
| CN | 104979353 A | | 10/2015 | |
| KR | 10-2018-001888 | * | 2/2018 | H01L 27/11206 |
| WO | WO 2021020082 | * | 2/2021 | H01L 27/11568 |

\* cited by examiner

OTP MEMORY AND METHOD FOR MAKING THE SAME

CROSS-REFERENCE TO RELATED APPLICATION

This application claims priority to co-pending Chinese patent application number 201911364749.3 filed at CNIPA on Dec. 26, 2019, entitled "OTP MEMORY AND METHOD FOR MAKING THE SAME", the disclosure of which is incorporated by reference herein its entirety.

TECHNICAL FIELD

The present application relates to the field of semiconductor integrated circuit manufacturing, in particular to a one-time programmable (OTP) memory; and the present application further relates to a method for manufacturing an OTP memory.

BACKGROUND

The OTP memory is a common non-volatile memory (NVM) and is primarily applied in the aspect of embedded NVMs with limited density and limited performance. The conventional NVMs such as the electrically erasable programmable read-only memory (EEPROM), the SONOS, and the embedded flash memory (E-Flash) are expensive. The embedded NVM technology by which the OTP memory is compatible with the CMOS is a successful solution in the current industry and is becoming more widely applied from the bit level in analog technology fine-tuning applications to the kilobit level of data or code storage.

Figure 1A:
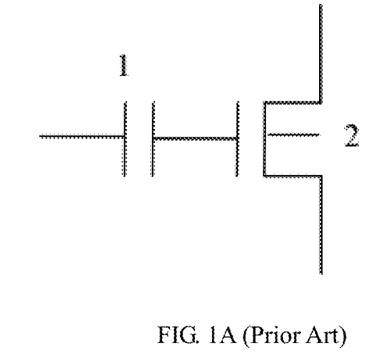
FIG. 1A is a schematic view of components of an existing first type OTP memory.
Figure 1B:
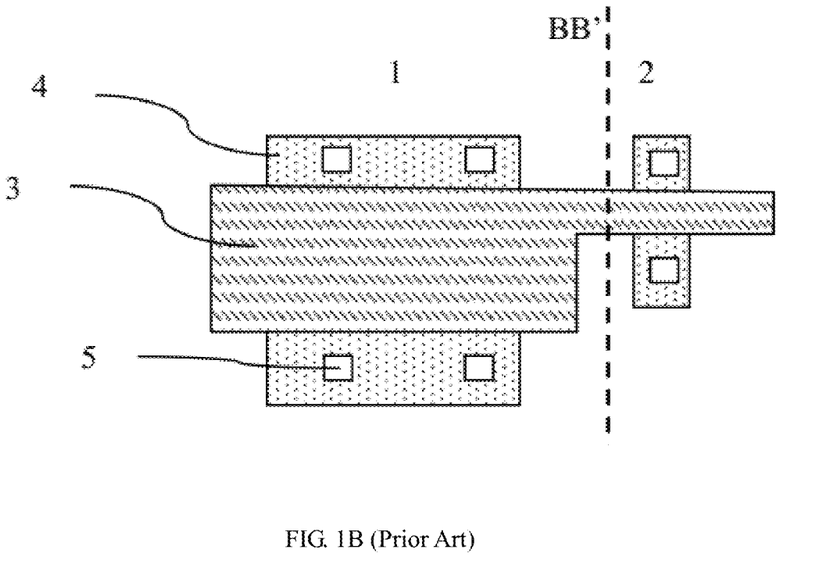
FIG. 1B is a schematic view of a layout corresponding to FIG. 1.

There are many types of structural designs for OTP memory cells, including the following three representative types:

The first type is a capacitor coupling type: FIG. 1A is a schematic view of components of an existing first type OTP memory, and FIG. 1B is a schematic view of a layout corresponding to FIG. 1A. The cell structure of the existing first type OTP memory adopts a transistor 2 and a floating gate capacitor 1 to implement the basic programming and charge storage functions of the OTP memory. One side of the dashed line BB' in FIG. 1B corresponds to the floating gate capacitor 1, and the other side corresponds to the transistor 2. The polysilicon gate of the transistor 2 and the top electrode of the floating gate capacitor 1 share the same polysilicon layer 3. The active region 4 corresponding to the source-drain region and the channel region of the transistor 2 is isolated from the active region 4 corresponding to the bottom electrode of the floating gate capacitor 1 by means of the field oxide. A contact hole 5 is used to lead out the electrode of the device, e.g., the source, drain, and gate of the transistor 2, and the lower electrode of the floating gate capacitor 1. The existing first type OTP memory has an excessively large memory cell area due to the existence of the floating gate coupling capacitor, which is not conducive to high-density applications at the kilobit level.

Figure 2:
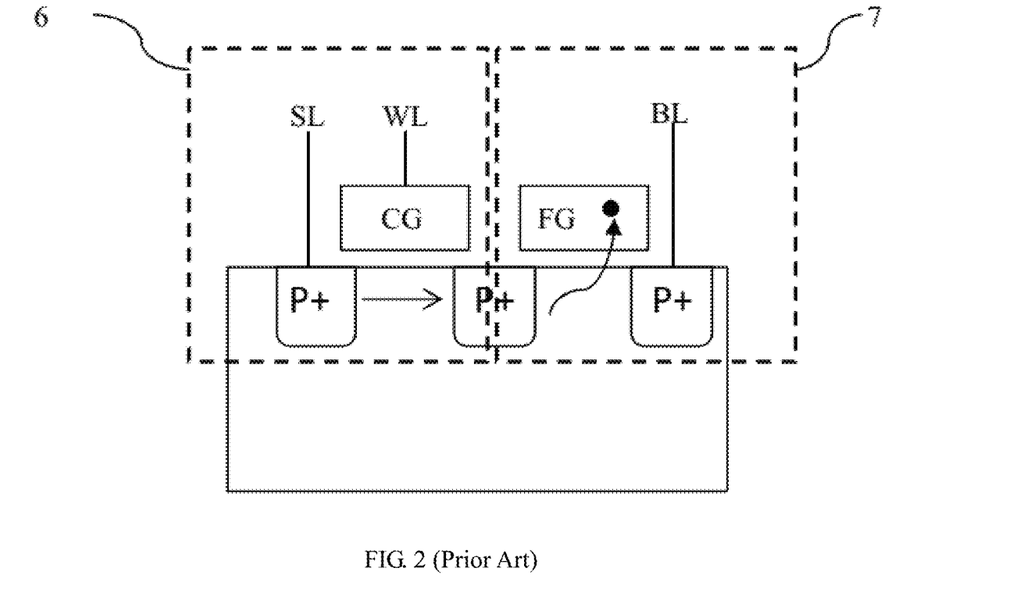
FIG. 2 is a schematic structural view of an existing second type OTP memory.

The second type is a series transistor type: FIG. 2 is a schematic structural view of an existing second type OTP memory. The cell structure of the existing second type OTP memory is a one-time programmable device monolithic structure formed by two PMOS transistors 6 and 7 connected in series. The first PMOS transistor 6 serves as a gate transistor, and the second PMOS transistor 7 serves as a memory cell of the device. Both the source region and the drain region of the first PMOS transistor 6 are formed by a P+ region, the drain region of the first PMOS transistor 6 and the source region of the second PMOS transistor 7 share the same region, and the source region of the first PMOS transistor 6 is connected to the source line SL, and the drain region of the second PMOS transistor 7 is formed by a P+ region and is connected to the bit line BL. The gate structure of the first PMOS transistor 6 is formed by stacking a gate dielectric layer such as a gate oxide layer and a polysilicon gate, the polysilicon gate of the first PMOS transistor 6 is a control gate (CG) and is connected to the word line WL, and the polysilicon gate of the first PMOS transistor 6 is represented by CG in FIG. 2. The gate structure of the second PMOS transistor 7 is formed by stacking a gate dielectric layer such as a gate oxide layer and a polysilicon gate, the polysilicon gate of the second PMOS transistor 7 is a floating gate (FG), and the polysilicon gate of the second PMOS transistor 7 is represented by FG in FIG. 2. During programming, the voltage difference between the word line WL and the source line SL makes the first PMOS transistor 6 conducting, for example, the voltage of the source line SL is 5V, and the voltage of the word line WL is 0V; and the voltage 0V of the bit line BL results in a hot carrier effect when the drain current of the first PMOS transistor 6 flows below the floating gate, and then hot carriers are injected into the floating gate, thereby implementing programming of the second PMOS transistor 7. The threshold voltage of the second PMOS transistor 7 is changed after the programming.

Figure 3:
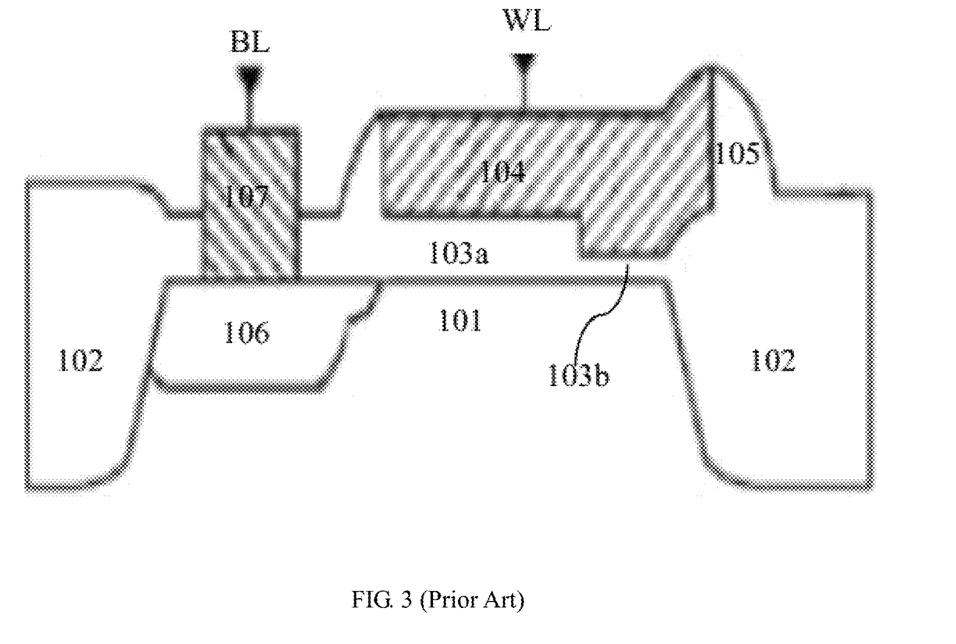
FIG. 3 is a schematic structural view of an existing third type OTP memory.

The third type is a dielectric breakdown type: FIG. 3 is a schematic structural view of an existing third type OTP memory, including a channel region 101 formed in an active region and isolated from the active region by means of a field oxide such as a shallow trench field oxide 102.

The gate structure includes a gate oxide layer and a polysilicon gate 104, and the gate oxide layer is laterally divided into a thick gate oxide layer 103a and a thin gate oxide layer 103b.

A side wall 105 is formed on the side of the polysilicon gate 104.

A drain region 106 is formed in the active region and is self-aligned with the side of the side wall 105 on the side of the polysilicon gate 104 close to the thick gate oxide layer 103a. The drain region 106 further includes a lightly doped drain (LDD) region, and the lightly doped drain region is self-aligned with the side of the polysilicon gate 104 close to the thick gate oxide layer 103a.

The drain region 106 is connected to the bit line BL by means of a contact hole 107, and the polysilicon gate 104 is connected to the word line WL.

In the structure shown in FIG. 3, since the thickness of the thin gate oxide layer 103b is relatively small, the thin gate oxide layer 103b is broken down during the programming.

BRIEF SUMMARY

The technical problem to be solved by the present application is to provide an OTP memory, which can implement high-speed writing. To this end, the present application further provides a method for manufacturing an OTP memory.

In order to solve the above technical problem, a cell structure of the OTP memory provided in the present application comprises: a first active region and a second active region.

The first active region and the second active region intersect vertically.

An EDNMOS is formed in the first active region, and a PMOS is formed in the second active region.

The EDNMOS comprises a first source region, a first channel region, a drift region, a first drain region, and a first gate structure, the first gate structure is formed by stacking a first gate dielectric layer and a first polysilicon gate, the direction from the first source region to the first drain region is a first direction, the doping types of the first source region, the drift region, and the first drain region are N-type, and the doping type of the first channel region is P-type.

The PMOS comprises a second source region, a second channel region, a second drain region, and a second gate structure, the second gate structure is formed by stacking a second gate dielectric layer and a second polysilicon gate, the direction from the second source region to the second drain region is a second direction, the first direction is perpendicular to the second direction, the doping types of the second source region and the second drain region are P-type, and the doping type of the second channel region is N-type.

The second polysilicon gate covers an overlap region of the first active region and the second active region and extends into the first active region and the second region that are outside the overlap region, in the first direction, the second polysilicon gate has a first side and a second side, and in the second direction, the second polysilicon gate has a third side and a fourth side.

The first side and the second side of the second polysilicon gate are located between a second side of the first polysilicon gate and a first side of the first drain region.

Doping of the drift region is also formed in the second active region, and a doping region of the drift region in the second active region covered by the second polysilicon gate and located in the overlap region and outside the overlap region forms the second channel region.

The first source region is self-aligned with a first side of the first polysilicon gate, and the first drain region is self-aligned with the second side of the second polysilicon gate.

The second source region is formed in the second active region and is self-aligned with the third side of the second polysilicon gate, and the second drain region is formed in the second active region and is self-aligned with the fourth side of the second polysilicon gate.

The first polysilicon gate serves as a control gate, and the second polysilicon gate serves as a floating gate.

The PMOS is programmed by means of injection of hot carriers, the hot carriers being generated in the drift region when the EDNMOS is conducting.

In a further improvement, the first channel region is formed by a P-well, and the first source region is formed in the P-well.

In a further improvement, the first drain region is formed in an N-well.

In a further improvement, lateral coverage of an N-type ion implantation region of the drift region is greater than lateral coverage of the N-well, a first side of the N-well is located between the first side and the second side of the second polysilicon gate, and a body region where the hot carriers are injected is located on the first side of the N-well.

In a further improvement, the outside of the first active region and the second active region is surrounded by a field oxide.

In a further improvement, the first source region, the first drain region, the first polysilicon gate, the second source region, and the second drain region are each connected to a corresponding electrode formed by a front metal layer by means of a contact hole.

In a further improvement, reading from the cell structure of the OTP memory is implemented by applying a voltage between the second source region and the second drain region.

In order to solve the above technical problem, in the method for manufacturing an OTP memory provided in the present application, manufacturing of a cell structure of the OTP memory comprises steps of:

step 1: defining a first active region and a second active region on a semiconductor substrate by means of a field oxide, wherein the first active region and the second active region intersect vertically;

step 2: respectively forming a first channel region of an EDNMOS in the first active region, wherein the doping type of the first channel region is P-type;

step 3: forming a drift region of the EDNMOS in the first active region, wherein the drift region is in lateral contact with the first channel region; doping of the drift region is also formed in the second active region; and the doping type of the drift region is N-type;

step 4: simultaneously forming a first gate structure of the EDNMOS and a second gate structure of a PMOS, wherein the first gate structure is formed by stacking a first gate dielectric layer and a first polysilicon gate, and the second gate structure is formed by stacking a second gate dielectric layer and a second polysilicon gate;

the first polysilicon gate covers the surface of the first channel region, and a second side of the first polysilicon gate extends above the drift region;

the second polysilicon gate covers an overlap region of the first active region and the second active region and extends into the first active region and the second region that are outside the overlap region; and a doping region of the drift region in the second active region covered by the second polysilicon gate and located in the overlap region and outside the overlap region forms a second channel region of the PMOS; and step 5: performing N+ source-drain implantation to form a first source region and a first drain region of the EDNMOS, and performing P+ source-drain implantation to form a second source region and a second drain region of the PMOS, wherein the direction from the first source region to the first drain region is a first direction, the direction from the second source region to the second drain region is a second direction, and the first direction is perpendicular to the second direction;

in the first direction, the second polysilicon gate has a first side and a second side, and in the second direction, the second polysilicon gate has a third side and a fourth side;

the first side and the second side of the second polysilicon gate are located between the second side of the first polysilicon gate and a first side of the first drain region;

the first source region is self-aligned with a first side of the first polysilicon gate, and the first drain region is self-aligned with the second side of the second polysilicon gate;

the second source region is formed in the second active region and is self-aligned with the third side of the second polysilicon gate, and the second drain region is formed in the second active region and is self-aligned with the fourth side of the second polysilicon gate;

the first polysilicon gate serves as a control gate, and the second polysilicon gate serves as a floating gate; and the PMOS is programmed by means of injection of hot carriers, the hot carriers being generated in the drift region when the EDNMOS is conducting.

In a further improvement, in step 2, a P-well is formed by means of a P-well formation process, the first channel region is formed by the P-well, and the first source region is formed in the P-well.

In a further improvement, after formation of the P-well in step 2, the method further comprises a step of forming an N-well, wherein the first drain region is formed in the N-well.

In a further improvement, in step 3, the drift region is formed by means of an N-type ion implantation process, lateral coverage of an N-type ion implantation region of the drift region is greater than lateral coverage of the N-well, a first side of the N-well is located between the first side and the second side of the second polysilicon gate, and a body region where the hot carriers are injected is located on the first side of the N-well.

In a further improvement, the N-type ion implantation region of the drift region is defined by means of a photolithography process, or implantation is performed in the whole drift region.

In a further improvement, in step 1, the field oxide comprises a shallow trench field oxide.

In a further improvement, after the step 5, the method further comprises steps of forming an interlayer film, a contact hole, and a front metal layer, and patterning the front metal layer to form a corresponding electrode, wherein the first source region, the first drain region, the first polysilicon gate, the second source region, and the second drain region are each connected to the corresponding electrode formed by the front metal layer by means of the contact hole.

In a further improvement, reading from the cell structure of the OTP memory is implemented by applying a voltage between the second source region and the second drain region.

In the present application, the EDNMOS and the PMOS are combined to form the cell structure of the OTP memory, such that programming of the polysilicon gate of the PMOS, i.e., the second polysilicon gate, is implemented by means of strong hot carrier injection (HCI) of the EDNMOS. Compared with a cell structure of an OTP memory formed by series transistors in the prior art, the HCI in the drift region of the EDNMOS in the present application is much stronger than HCI of the PMOS. Therefore, in the present application, a writing speed can be increased significantly, thereby implementing high-speed writing.

The active regions of the EDNMOS and the PMOS in the present application are perpendicular to each other, so the EDNMOS does not need to be conducting during reading, and the reading can be directly performed on the PMOS. Therefore, a reading operation on the cell structure of the OTP memory in the present application is simple and fast.

BRIEF DESCRIPTION OF THE DRAWINGS

The present application will be further described in detail below with reference to the drawings and specific implementations.

DETAILED DESCRIPTION OF THE DISCLOSURE

Figure 4:
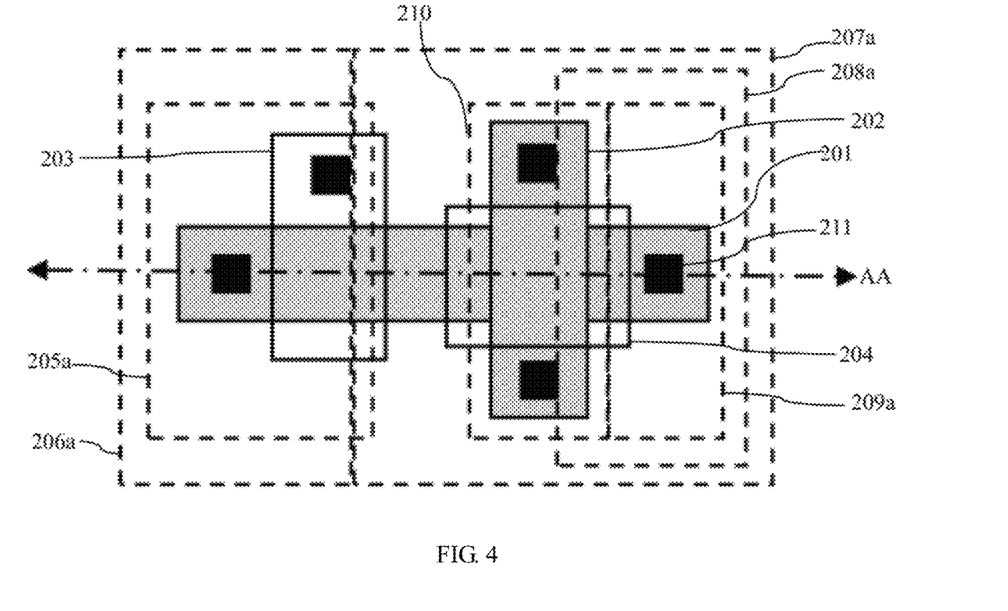
FIG. 4 shows a layout of an OTP memory in an embodiment of the present application.
Figure 5:
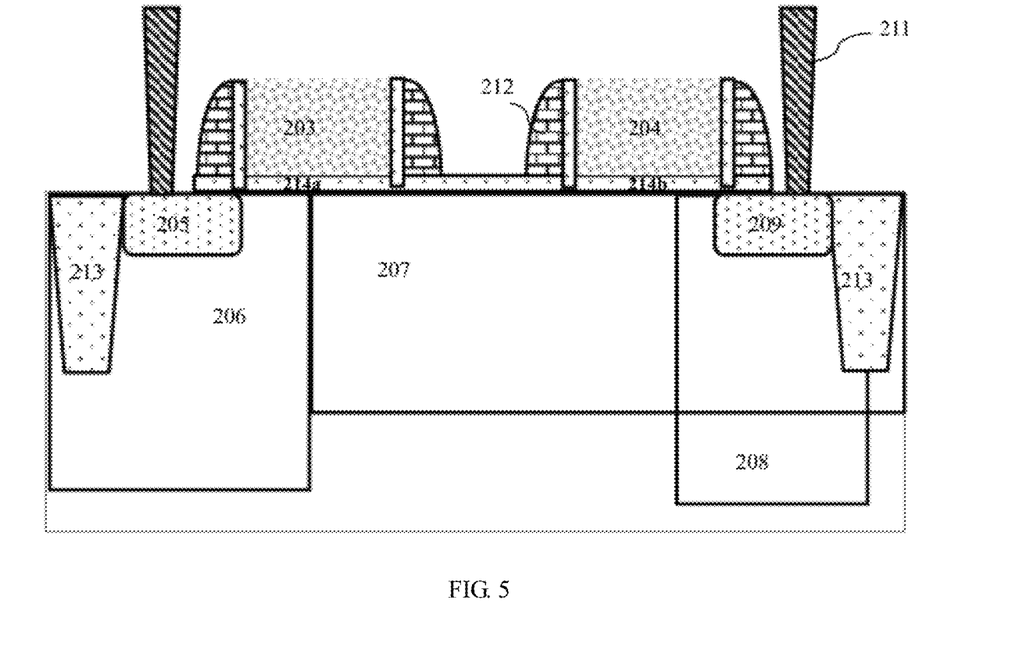
FIG. 5 is a sectional view along line AA in FIG. 4 of the OTP memory in the embodiment of the present application.

Referring to FIG. 4, which shows a layout of an OTP memory in an embodiment of the present application, and referring to FIG. 5, which is a sectional view along line AA in FIG. 4 of the OTP memory in the embodiment of the present application, it can be seen that a cell structure of the OTP memory provided in the embodiment of the present application includes: a first active region 201 and a second active region 202.

The first active region 201 and the second active region 202 intersect vertically.

An EDNMOS is formed in the first active region 201, and a PMOS is formed in the second active region 202.

The EDNMOS includes a first source region 205, a first channel region 206, a drift region 207, a first drain region 209, and a first gate structure, the first gate structure is formed by stacking a first gate dielectric layer 214a and a first polysilicon gate 203, the direction from the first source region 205 to the first drain region 209 is a first direction, the doping types of the first source region 205, the drift region 207, and the first drain region 209 are N-type, and the doping type of the first channel region 206 is P-type. In FIG. 4, an ion implantation region of the first source region 205 is shown in a dashed line box 205a, an ion implantation region of the first channel region 206 is shown in a dashed line box 206a, an ion implantation region of the drift region 207 is shown in a dashed line box 207a, and an ion implantation region of the first drain region 209 is shown in a dashed line box 209a.

The PMOS includes a second source region, a second channel region, a second drain region, and a second gate structure, the second gate structure is formed by stacking a second gate dielectric layer 214b and a second polysilicon gate 204, the direction from the second source region to the second drain region is a second direction, the first direction is perpendicular to the second direction, the doping types of the second source region and the second drain region are P-type, and the doping type of the second channel region is N-type. In FIG. 4, ion implantation regions of the second source region and the second drain region are shown in a dashed line box 210, and ions in the dashed line box 210 are implanted into the active region 202 on two sides of the second polysilicon gate 204, to respectively form the second source region and the second drain region.

The second polysilicon gate 204 covers an overlap region of the first active region 201 and the second active region 201 and extends into the first active region 201 and the second region 201 that are outside the overlap region, in the first direction, the second polysilicon gate 204 has a first side and a second side, and in the second direction, the second polysilicon gate 204 has a third side and a fourth side.

The first side and the second side of the second polysilicon gate 204 are located between a second side of the first polysilicon gate 203 and a first side of the first drain region 209.

Doping of the drift region 207 is also formed in the second active region 202, and a doping region of the drift region 207 in the second active region 202 covered by the second polysilicon gate 204 and located in the overlap region and outside the overlap region forms the second channel region.

The first source region 205 is self-aligned with a first side of the first polysilicon gate 203, and the first drain region 209 is self-aligned with the second side of the second polysilicon gate 204.

The second source region is formed in the second active region 202 and is self-aligned with the third side of the second polysilicon gate 204, and the second drain region is formed in the second active region 202 and is self-aligned with the fourth side of the second polysilicon gate 204.

The first polysilicon gate 203 serves as a control gate, and the second polysilicon gate 204 serves as a floating gate.

The PMOS is programmed by means of injection of hot carriers, the hot carriers being generated in the drift region 207 when the EDNMOS is conducting.

In the embodiment of the present application, the first channel region 206 is formed by a P-well, and the first source region 205 is formed in the P-well.

The first drain region 209 is formed in an N-well 208. In FIG. 4, an ion implantation region of the N-type well 208 is shown in a dashed line box 208a.

Figure 6:
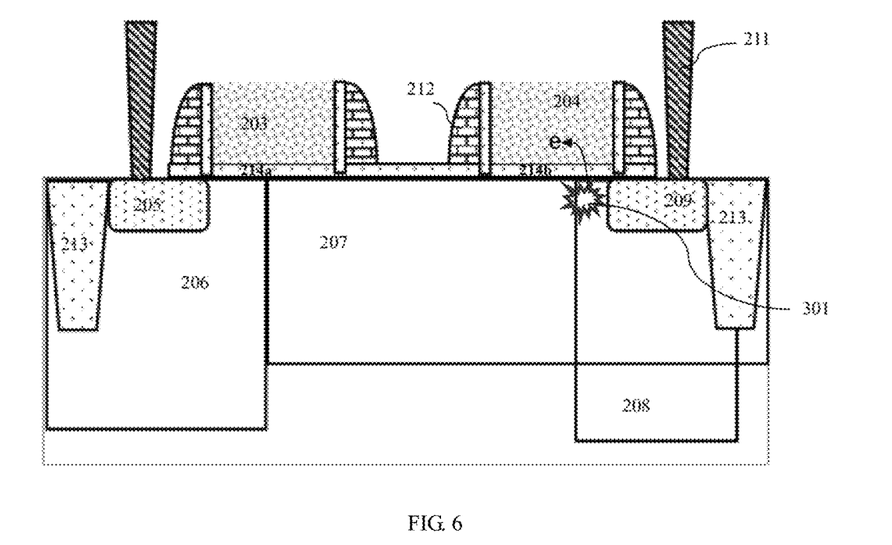
FIG. 6 is a schematic view of hot carrier injection during programming of the device shown in FIG. 5.
Figure 7:
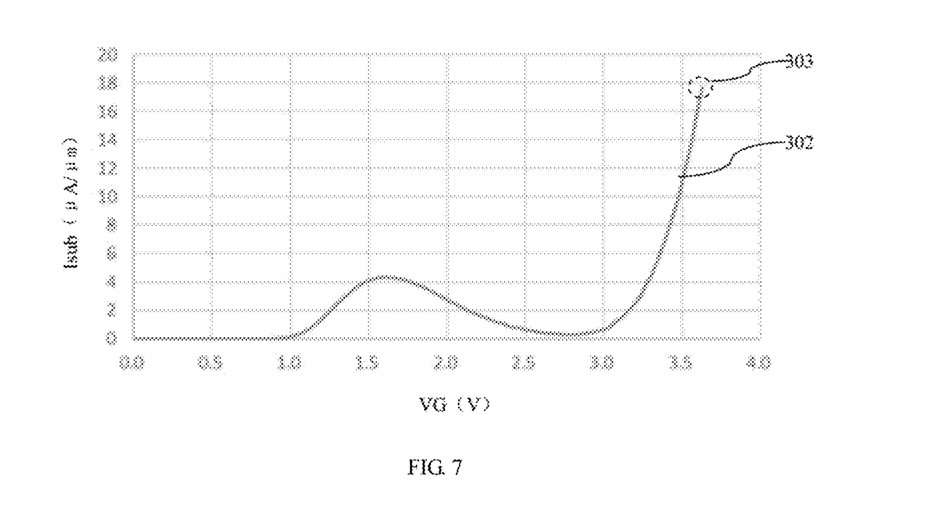
FIG. 7 shows a curve of a gate voltage and a substrate current of an EDNMOS in the programming of the device shown in FIG. 5.

Lateral coverage of an N-type ion implantation region of the drift region 207 is greater than lateral coverage of the N-well 208, a first side of the N-well 208 is located between the first side and the second side of the second polysilicon gate 204, and a body region where the hot carriers are injected is located on the first side of the N-well 208. Referring to FIG. 6, mark 301 in FIG. 6 corresponds to a situation where the hot carrier injection occurs, corresponding hot carriers are electrons represented by e, and finally the hot electrons are injected into the second polysilicon gate 204; and the hot carrier injection corresponding to mark 301 generally occurs on the surface of the drift region 207. FIG. 7 shows a curve of a gate voltage VG and a substrate current Isub of the EDNMOS in programming of the device shown in FIG. 5. During the programming, the gate voltage of the EDNMOS makes the EDNMOS conducting, then a current is generated in the drift region of the EDNMOS, the current forms hot electrons under the effect of a high voltage of the first drain region 209, and the hot electrons are injected into the second polysilicon gate 204. A dashed line circle 303 in FIG. 7 corresponds to the hot electron injection represented by mark 301 in FIG. 6.

The outside of the first active region 201 and the second active region 202 is surrounded by a field oxide 213. Generally, a side wall 212 is further formed on the sides of the first polysilicon gate 203 and the second polysilicon gate 204.

The first source region 205, the first drain region 209, the first polysilicon gate 203, the second source region, and the second drain region are each connected to a corresponding electrode formed by a front metal layer by means of a contact hole 211.

Reading from the cell structure of the OTP memory is implemented by applying a voltage between the second source region and the second drain region.

In the embodiment of the present application, the EDNMOS and the PMOS are combined to form the cell structure of the OTP memory, such that programming of the polysilicon gate of the PMOS, i.e., the second polysilicon gate 204, is implemented by means of strong hot carrier injection (HCI) of the EDNMOS. Compared with a cell structure of an OTP memory formed by series transistors in the prior art, the HCI in the drift region 207 of the EDNMOS in the embodiment of the present application is much stronger than HCI of the PMOS. Therefore, in the embodiment of the present application, a writing speed can be increased significantly, thereby implementing high-speed writing.

The active regions of the EDNMOS and the PMOS in the embodiment of the present application are perpendicular to each other, so the EDNMOS does not need to be conducting during reading, and the reading can be directly performed on the PMOS. Therefore, a reading operation on the cell structure of the OTP memory in the embodiment of the present application is simple and fast.

In a method for manufacturing an OTP memory provided in the embodiment of the present application, manufacturing of a cell structure of the OTP memory includes the following steps.

Step 1: A first active region 201 and a second active region 202 are defined on a semiconductor substrate by means of a field oxide 213. Generally, the semiconductor substrate is a silicon substrate. The field oxide 213 is formed by means of a shallow trench isolation (STI) process.

The first active region 201 and the second active region 202 intersect vertically.

Step 2: A first channel region 206 of an EDNMOS is respectively formed in the first active region 201, wherein the doping type of the first channel region 206 is P-type.

A P-well is formed by means of a P-well formation process, the first channel region 206 is formed by the P-well, and subsequent formation of a first source region 205 is formed in the P-well. An implantation region of the P-well is respectively shown in the dashed line box 206a in FIG. 4.

After formation of the P-well, the method further includes a step of forming an N-well 208, and subsequent formation of a first drain region 209 is performed in the N-well 208. An implantation region of the N-well 28 is respectively shown in the dashed line box 208a in FIG. 4.

Step 3: A drift region 207 of the EDNMOS is formed in the first active region 201, wherein the drift region 207 is in lateral contact with the first channel region 206; and doping of the drift region 207 is also formed in the second active region 202.

The doping type of the drift region 207 is N-type.

The drift region 207 is formed by means of an N-type ion implantation process, lateral coverage of an N-type ion implantation region of the drift region 207 is greater than lateral coverage of the N-well 208, a first side of the N-well 208 is located between the first side and the second side of the second polysilicon gate 204, and a body region where the hot carriers are injected is located on the first side of the N-well 208. In the method provided in the embodiment of the present application, the N-type ion implantation region of the drift region 207 is defined by means of a photolithography process, and an implantation region of the drift region 207 is respectively shown in the dashed line box 207a in FIG. 4. In the method provided in other embodiment of the present application, implantation can be performed in the whole drift region 207, that is, photolithography definition does not need to be performed.

Step 4: A first gate structure of the EDNMOS and a second gate structure of a PMOS are simultaneously formed.

The first gate structure is formed by stacking a first gate dielectric layer 214a and a first polysilicon gate 203, and the second gate structure is formed by stacking a second gate dielectric layer 214b and a second polysilicon gate 204.

The first polysilicon gate 203 covers the surface of the first channel region 206, and a second side of the first polysilicon gate 203 extends above the drift region 207.

The second polysilicon gate 204 covers an overlap region of the first active region 201 and the second active region 202 and extends into the first active region 201 and the second region 02 that are outside the overlap region; and a doping region of the drift region 207 in the second active region 202 covered by the second polysilicon gate 204 and located in the overlap region and outside the overlap region forms a second channel region of the PMOS.

Step 5: N+ source-drain implantation is performed to form a first source region 205 and a first drain region 209 of the EDNMOS, wherein implantation regions of the N+ source-drain implantation are respectively shown in the dashed line boxes 205a and 209a in FIG. 4; and P+ source-drain implantation is performed to form a second source region and a second drain region of the PMOS, wherein an implantation region of the P+ source-drain implantation is respectively shown in the dashed line box 210 in FIG. 4.

The direction from the first source region 205 to the first drain region 209 is a first direction, the direction from the second source region to the second drain region is a second direction, and the first direction is perpendicular to the second direction.

In the first direction, the second polysilicon gate 204 has a first side and a second side, and in the second direction, the second polysilicon gate 204 has a third side and a fourth side.

The first side and the second side of the second polysilicon gate 204 are located between the second side of the first polysilicon gate 203 and a first side of the first drain region 209.

The first source region 205 is self-aligned with a first side of the first polysilicon gate 203, and the first drain region 209 is self-aligned with the second side of the second polysilicon gate 204.

The second source region is formed in the second active region 202 and is self-aligned with the third side of the second polysilicon gate 204, and the second drain region is formed in the second active region 202 and is self-aligned with the fourth side of the second polysilicon gate 204.

The first polysilicon gate 203 serves as a control gate, and the second polysilicon gate 204 serves as a floating gate.

The PMOS is programmed by means of injection of hot carriers, and the hot carriers are generated in the drift region 207 when the EDNMOS is conducting.

After the step 5, the method further includes steps of forming an interlayer film, a contact hole 211, and a front metal layer, and patterning the front metal layer to form a corresponding electrode, wherein the first source region 205, the first drain region 209, the first polysilicon gate 203, the second source region, and the second drain region are each connected to the corresponding electrode formed by the front metal layer by means of the contact hole 211.

In the device formed by means of the method provided in the embodiment of the present application, reading from the cell structure of the OTP memory is implemented by applying a voltage between the second source region and the second drain region.

The present application is described in detail above via specific embodiments, but these embodiments are not intended to limit the present application. Without departing from the principle of the present application, those skilled in the art can still make many variations and improvements, which should also be considered to fall into the protection scope of the present application.

What is claimed is:

1. An OTP memory, wherein a cell structure of the OTP memory comprises:
   a first active region and a second active region;
   the first active region and the second active region intersect vertically;
   an EDNMOS is formed in the first active region, and a PMOS is formed in the second active region;
   the EDNMOS comprises a first source region, a first channel region, a drift region, a first drain region, and a first gate structure, the first gate structure is formed by stacking a first gate dielectric layer and a first polysilicon gate, the direction from the first source region to the first drain region is a first direction, the doping types of the first source region, the drift region, and the first drain region are N-type, and the doping type of the first channel region is P-type;
   the PMOS comprises a second source region, a second channel region, a second drain region, and a second gate structure, the second gate structure is formed by stacking a second gate dielectric layer and a second polysilicon gate, the direction from the second source region to the second drain region is a second direction, the first direction is perpendicular to the second direction, the doping types of the second source region and the second drain region are P-type, and the doping type of the second channel region is N-type;
   the second polysilicon gate covers an overlap region of the first active region and the second active region and extends into the first active region and the second region that are outside the overlap region, in the first direction, the second polysilicon gate has a first side and a second side, and in the second direction, the second polysilicon gate has a third side and a fourth side;
   the first side and the second side of the second polysilicon gate are located between a second side of the first polysilicon gate and a first side of the first drain region;
   doping of the drift region is also formed in the second active region, and a doping region of the drift region in the second active region covered by the second polysilicon gate and located in the overlap region and outside the overlap region forms the second channel region;
   the first source region is self-aligned with a first side of the first polysilicon gate, and the first drain region is self-aligned with the second side of the second polysilicon gate;
   the second source region is formed in the second active region and is self-aligned with the third side of the second polysilicon gate, and the second drain region is formed in the second active region and is self-aligned with the fourth side of the second polysilicon gate;
   the first polysilicon gate serves as a control gate, and the second polysilicon gate serves as a floating gate; and
   the PMOS is programmed by means of injection of hot carriers, the hot carriers being generated in the drift region when the EDNMOS is conducting.

2. The OTP memory according to claim 1, wherein the first channel region is formed by a P-well, and the first source region is formed in the P-well.

3. The OTP memory according to claim 2, wherein the first drain region is formed in an N-well.

4. The OTP memory according to claim 3, wherein lateral coverage of an N-type ion implantation region of the drift region is greater than lateral coverage of the N-well, a first side of the N-well is located between the first side and the second side of the second polysilicon gate, and a body region where the hot carriers are injected is located on the first side of the N-well.

5. The OTP memory according to claim 1, wherein the outside of the first active region and the second active region is surrounded by a field oxide.

6. The OTP memory according to claim 1, wherein the first source region, the first drain region, the first polysilicon gate, the second source region, and the second drain region are each connected to a corresponding electrode formed by a front metal layer by means of a contact hole.

7. The OTP memory according to claim 6, wherein reading from the cell structure of the OTP memory is implemented by applying a voltage between the second source region and the second drain region.

8. A method for manufacturing an OTP memory, wherein manufacturing of a cell structure of the OTP memory comprises steps of:

step 1: defining a first active region and a second active region on a semiconductor substrate by means of a field oxide, wherein the first active region and the second active region intersect vertically;

step 2: respectively forming a first channel region of an EDNMOS in the first active region, wherein the doping type of the first channel region is P-type;

step 3: forming a drift region of the EDNMOS in the first active region, wherein the drift region is in lateral contact with the first channel region; doping of the drift region is also formed in the second active region; and the doping type of the drift region is N-type;

step 4: simultaneously forming a first gate structure of the EDNMOS and a second gate structure of a PMOS, wherein the first gate structure is formed by stacking a first gate dielectric layer and a first polysilicon gate, and the second gate structure is formed by stacking a second gate dielectric layer and a second polysilicon gate;

the first polysilicon gate covers the surface of the first channel region, and a second side of the first polysilicon gate extends above the drift region;

the second polysilicon gate covers an overlap region of the first active region and the second active region and extends into the first active region and the second region that are outside the overlap region; and a doping region of the drift region in the second active region covered by the second polysilicon gate and located in the overlap region and outside the overlap region forms a second channel region of the PMOS; and step 5: performing N+ source-drain implantation to form a first source region and a first drain region of the EDNMOS, and performing P+ source-drain implantation to form a second source region and a second drain region of the PMOS, wherein the direction from the first source region to the first drain region is a first direction, the direction from the second source region to the second drain region is a second direction, and the first direction is perpendicular to the second direction;

in the first direction, the second polysilicon gate has a first side and a second side, and in the second direction, the second polysilicon gate has a third side and a fourth side;

the first side and the second side of the second polysilicon gate are located between the second side of the first polysilicon gate and a first side of the first drain region;

the first source region is self-aligned with a first side of the first polysilicon gate, and the first drain region is self-aligned with the second side of the second polysilicon gate;

the second source region is formed in the second active region and is self-aligned with the third side of the second polysilicon gate, and the second drain region is formed in the second active region and is self-aligned with the fourth side of the second polysilicon gate;

the first polysilicon gate serves as a control gate, and the second polysilicon gate serves as a floating gate; and the PMOS is programmed by means of injection of hot carriers, the hot carriers being generated in the drift region when the EDNMOS is conducting.

9. The method for manufacturing an OTP memory according to claim 8, wherein in step 2, a P-well is formed by means of a P-well formation process, the first channel region is formed by the P-well, and the first source region is formed in the P-well.

10. The method for manufacturing an OTP memory according to claim 9, wherein after formation of the P-well in step 2, further comprising a step of forming an N-well, wherein the first drain region is formed in the N-well.

11. The method for manufacturing an OTP memory according to claim 10, wherein in step 3, the drift region is formed by means of an N-type ion implantation process, lateral coverage of an N-type ion implantation region of the drift region is greater than lateral coverage of the N-well, a first side of the N-well is located between the first side and the second side of the second polysilicon gate, and a body region where the hot carriers are injected is located on the first side of the N-well.

12. The method for manufacturing an OTP memory according to claim 11, wherein the N-type ion implantation region of the drift region is defined by means of a photolithography process, or implantation is performed in the whole drift region.

13. The method for manufacturing an OTP memory according to claim 8, wherein in step 1, the field oxide comprises a shallow trench field oxide.

14. The method for manufacturing an OTP memory according to claim 8, wherein after the step 5, further comprising steps of forming an interlayer film, a contact hole, and a front metal layer, and patterning the front metal layer to form a corresponding electrode, wherein the first source region, the first drain region, the first polysilicon gate, the second source region, and the second drain region are each connected to the corresponding electrode formed by the front metal layer by means of the contact hole.

15. The method for manufacturing an OTP memory according to claim 14, wherein reading from the cell structure of the OTP memory is implemented by applying a voltage between the second source region and the second drain region.

* * * * *